(12) United States Patent
Herlogsson et al.

(10) Patent No.: US 7,646,013 B2
(45) Date of Patent: Jan. 12, 2010

(54) TRANSISTOR WITH LARGE ION-COMPLEXES IN ELECTROLYTE LAYER

(75) Inventors: Lars Herlogsson, Linköping (SE);
Göran Gustafsson, Linkoping (SE);
Olle-Johnny Hagel, Linkoping (SE);
Mats Sandberg, Norrköping (SE);
Magnus Berggren, Vreta Kloster (SE);
Xavier Crispin, Kimstad (SE);
Nathaniel Robinson, Kolmdroen (SE)

(73) Assignee: Acreo AB, Kista (SE)

( * ) Notice: Subject to any disclaimer, the term of this patent is extended or adjusted under 35 U.S.C. 154(b) by 378 days.

(21) Appl. No.: 11/594,995

(22) Filed: Nov. 9, 2006

(65) Prior Publication Data

US 2007/0138463 A1    Jun. 21, 2007

(30) Foreign Application Priority Data

Nov. 9, 2005    (EP) .................................. 05110565

(51) Int. Cl.
*H01L 51/00*    (2006.01)
(52) U.S. Cl. .................... 257/40; 257/E51.001; 438/99
(58) Field of Classification Search .......... 257/E51.001, 257/E51.003, E51.004, E51.005, E51.024, 257/E51.025, E51.027, 40; 438/99, 780
See application file for complete search history.

(56) References Cited

U.S. PATENT DOCUMENTS

| 6,060,333 | A | | 5/2000 | Tanaka et al. | |
|---|---|---|---|---|---|
| 6,084,044 | A | * | 7/2000 | Roe et al. | .................... 526/193 |
| 7,265,379 | B2 | * | 9/2007 | Sandberg et al. | ............... 257/40 |
| 2004/0036067 | A1 | * | 2/2004 | Andriessen | .................. 257/40 |
| 2004/0211989 | A1 | | 10/2004 | Armgarth et al. | |

OTHER PUBLICATIONS

Panzer et al., "Low-voltage operation of a pentacene field-effect transistor with a polymer electrolyte gate dielectric." American Institute of Physics vol. 86, No. 10 (2005): pp. 1-3 (corresponding to pp. 103503-1 to 103503-3).*
European Search Report dated May 19, 2006 for corresponding European Application No. 05110565.8.
European Search Report dated Apr. 16, 2007 for corresponding European Application No. 06123785.5.
Nilsson et al., "Bi-stable and Dynamic Current modulation in Electrochemical Organic Transistors," *Advanced Materials*, vol. 14, No. 1, pp. 51-54 (Jan. 4, 2002).

(Continued)

*Primary Examiner*—Matthew Smith
*Assistant Examiner*—Michele Fan
(74) *Attorney, Agent, or Firm*—Harness, Dickey & Pierce, PLC (57) ABSTRACT

A fast organic field effect transistor (100), which operates at low voltages, is achieved by the introduction of an oligomeric or polymeric electrolyte (131) between the gate electrode (141) and the organic semiconductor layer (121), which electrolyte (131) has a dissociation constant of at least 10–8. Said organic semiconductor layer (121) is in contact with the source electrode (111) and the drain electrode (112) of the transistor. In operation a potential (152) applied to said gate electrode (141) controls the current A between said source electrode (111) and said drain electrode (112).

31 Claims, 6 Drawing Sheets

OTHER PUBLICATIONS

Veres et al., "Low-$k$ Insulators as the Choice of Dielectrics in Organic Field-Effect Transistors," *Advanced Functional Materials,* vol. 13, No. 3 (Mar. 2003).

Panzer et al., "Low-voltage operation of a pentacene field-effect transistor with a polymer electrolyte gate dielectric," *Am. Inst. Phys.,* vol. 86, No. 10, (Feb. 28, 2005).

Hepp et al., "Electrochemical Interface Doping in Organic Light Emitting Field Effect Transistors," *IEE Stevenage,* pp. 957-960 (Oct. 2005).

Chao et al. "Characterization of a 'Solid State' Polyaniline-Based Transistor: Water Vapor Dependent Characteristics of a Device Employing a Poly(vinyl alcohol)/Phosphoric Acid Solid-State Electrolyte," *ACS,* vol. 109, No. 22, pp. 6627-6631 (Oct. 28, 1987).

Matmour et al., Synthesis and Investigation of Surface Properties of Dendrimer-like Copolymers Based on Polystyrene and Poly(*tert*-butylacrylate), *Macromolecules,* vol. 38, No. 13, pp. 559-5467 (Jun. 28, 2005).

Panzer et al., "High Carrier Density and Metallic Conductivity in Poly(3-hexylthiophene) Achieved by Electrostatic Charge Injection," *Adv. Funct. Mater.,* vol. 16, pp. 1051-1056 (2006).

Sami Abdelfatah I. Elhag, "A low-voltage plastic transistor," Master Thesis (Jun.-Nov. 2005).

Elias Said et al., "Polymer field-effect transistor gated via a poly(styrenesulfonic acid) thin film," AlChE Annual Mtg., Nov. 2006).

\* cited by examiner

TRANSISTOR WITH LARGE ION-COMPLEXES IN ELECTROLYTE LAYER

PRIORITY STATEMENT

This application claims benefit of priority under 35 U.S.C. § 119 from European Patent Application No. 05110565.8 filed on Nov. 9, 2006, in the European Patent Office, the disclosure of which is incorporated herein by reference in its entirety.

TECHNICAL FIELD

The invention relates generally to Field-Effect Transistors (FET) and more specifically to Organic Field-Effect Transistors.

BACKGROUND ART

There are two main categories of organic transistors: electrochemical transistors (ECT) and field-effect transistors (FET).

Typically, in an ECT the transistor channel is formed of an electrochemically active layer, and the conductivity of the transistor channel is altered by changing its electrochemical redox state (electrochemical doping). In other words, one oxidation state of the channel corresponds to low channel conductivity (the transistor is OFF), while the other oxidation state corresponds to high channel conductivity (the transistor is ON). The transistor channel is normally defined by the bulk of the electrochemical active layer located between the source and drain electrodes, which is in ionic contact with an electrolyte layer. The active section in the channel is defined by the thickness of the electrochemically active layer. In order to switch the electrochemically active layer between the two oxidation states, ions need to migrate between the electrolyte layer and the bulk of the electrochemically active layer. This migration is controlled by a voltage applied to the gate electrode. Hence, there is a transport of active ions, i.e. ions which participate in the electrochemical reaction of the switch channel, between the electrolyte and the bulk of the electrochemical active layer. A more detailed description can be found in U.S. Pat. No. 6,806,511.

Traditional OFETs have an organic semiconductor film (the channel) that is separated from an electrode (the gate) by a thin film insulator, made of e.g. silicon oxide, metal oxide etc. This gate-insulator-organic semiconductor sandwich is analogous to a capacitor that causes field-effect current modulation in the channel (between said source and drain electrodes which contact the semiconductor film). Hence the current between the source and drain electrodes can be adjusted, by tuning the voltage applied to the gate electrode.

Organic Field-Effect Transistors (OFET) along with other "plastic" electronic devices are a platform for printed, flexible and fully-integrated electronics. Ideally, these systems should be fast, operate at low voltage, and be robust enough to be manufactured using standard printing techniques.

Tremendous effort has been devoted to reach high capacity (per unit area) Ci between the gate and the channel to allow transistors to operate at low voltage. Various kinds of inorganic and organic high-permittivity insulators have been explored. Alternatively, molecular assembly and self-organisation techniques have been utilised to manufacture gate dielectric layers only a few nanometers thick. These latter approaches sacrifice ease-of-manufacturing for low-voltage operation.

SUMMARY OF THE INVENTION

The object of the invention is to provide an improved field-effect transistor. This object is achieved by a device in accordance with the appended claims. Preferred embodiments are defined in the dependent claims.

The inventors have unexpectedly found that if the insulating material of traditional OFETs is exchanged for a certain type of polyelectrolytes or oligomeric electrolytes, the properties of the resulting transistor are substantially improved compared to known transistors.

According to a first aspect, the invention provides a field-effect transistor device comprising a semiconductor layer, which is arranged in electronic contact with a source electrode and a drain electrode. Said transistor device further comprises a gate electrode and an electrolyte layer, which layer is arranged between said gate electrode and said organic semiconductor layer. Moreover, said electrolyte layer comprises an oligomeric electrolyte or polyelectrolyte having a dissociation constant of at least $10^{-8}$, preferably $10^{-6}$ and even more preferred $10^{-3.5}$.

According to a second aspect, the invention provides a method of controlling an organic field-effect transistor as defined above, comprising the step primarily of controlling the current between said source and drain electrodes within said organic semiconductor layer by polarizing said electrolyte layer, such that charge carriers are induced in said semiconductor layer.

A first advantage associated with the invention is that the obtained OFET is fast, i.e. it quickly follows to a change in the applied control voltage. A second advantage is that it is it operates at a low voltage, i.e. it is energy effective. A third advantage is that it is robust, i.e. it is time invariant, easy to manufacture and does not require critical device dimensions. In other words, the exact position of the gate electrode with respect to said source and drain electrodes is not crucial.

An electrolyte is an electrical conductor in which current is carried by ions rather than by free electrons (as in a metal). Electrolytes are e.g. water solutions of acids, bases, or salts; certain pure liquids; and molten salts. Gases may act as electrolytes under conditions of high temperature or low pressure. All inorganic acids, bases, and salts are electrolytes. Electrolytic substances are classified as strong or weak according to how readily they dissociate into conducting ions. Potassium chloride and sodium hydroxide are strong electrolytes; they are almost completely dissociated when in solution or fused. Acetic acid is a weak electrolyte.

The dissociation constant for an acid in aqueous solution (the acid constant) is normally symbolized by $K_a$ and that for a base by $K_b$. These equilibrium constants for the dissociation of an acid or a base are independent of concentration, and hence is a measure of the relative strength of various acids and bases. More generally, the dissociation constant can be defined for other substances than acids and bases, such as salts and organo-metallic complexes. All those materials can generate ions upon dissociation. The dissociation constant is defined as the concentration of dissociated poly-ions (or oligo-ions) times the concentration of counterions divided by the concentration of undissociated species. The constants measure the ability of a material to dissociate in charged parts (ions) in a certain medium. This is used to classify the strength of an acid or a base, or the solubility of a salt or the stability of an organo-metallic complex. In other words, the dissociation constant is used to characterize the ability of an oligomer or polymer to release ions, upon dissociation of various types of chemical groups, and thus play the role of an electrolyte.

Moreover, in this document $pK_a$ equals $pK_{a1}$ for those acids which have both a $pK_{a1}$ value and a $pK_{a2}$ value. For example, phosphonic acid molecules have a $pK_{a1}$ value of about 2.5+/−0.5 and a $pK_{a2}$ value of about 7.5+/−0.5.

With respect to this invention the dissociation constant is not used to describe the actual dissociation constant of the electrolyte comprised in the transistor—as such a description is normally only meaningful for polymers or oligomers in aqueous solutions. Rather, in this document the dissociation constant is used to indicate suitable polymers for use in the inventive transistor.

Further, the polymers or oligomers in the electrolyte are preferably cross-linked, preferably by an external cross-linker, and even more preferred by a molecule having two or more glycidyl groups. Most preferably, the external cross-linker is polyethylene glycol diglycidyl ether. When the polymer is cross-linked its mobility is reduced, and hence its ability to penetrate into the organic semiconductor material. Further, a crosslinked polymer facilitates the manufacturing of said transistor. Said polymer is can also be cross-linked by internal cross-linking, normally accomplished by treatment with heat or irradiation. Normally, water is added to the electrolyte solution in order to enable or facilitate the manufacturing of the transistor.

In accordance with the invention the electrolyte layer is preferably arranged such that when an electric field is applied across said layer, charge carriers or ions which are available within said layer, will electromigrate toward the respective surface or side of the material, in accordance with the applied electric field. For instance, available cations will move toward a negatively biased gate electrode. The anions are normally immobile as they are fixed on the polymer (oligomer) chains (resulting in a polyanion).

In this document the expression that two materials are 'in electronic contact' means that an exchange of electrons is enabled between the two materials. Hence, in the context of this invention it also means that if the organic semiconductor material is in a conducting state, and a voltage is applied to said source electrode and said drain electrode, a current will flow through said semiconductor material, across the 'transistor channel', from said source to said drain electrode.

Advantageously the electron conductivity of the electrolyte material is low such that a leakage current due to an electron flow from the gate electrode to the drain electrode is negligible compared to the source-drain current of the transistor.

An electric field can also be formed inside said electrolyte layer, even if the gate electrode is arranged such that it faces said source and drain electrodes. In other words, the gate electrode may be laterally displaced along the surface of said electrolyte layer, with respect to said source and drains electrodes. According to one embodiment of the invention the three electrodes (source, drain and gate) are arranged in one common plane.

The electrodes and the electrolyte material of the inventive field-effect transistor are arranged such that an electric double layer is formed at the interface between said organic semiconductor layer and the electrolyte layer when a difference in electrical potential is applied between source (or drain) electrode and the gate electrode.

Advantageously, the electrolyte layer is arranged such that after a voltage is applied to the electrodes, the electric field is focused at a first and a second surface of said electrolyte material. Said first surface is the surface of the electrolyte material which faces the positive electrode, and said second surface is the surface of the electrolyte material which faces the negative electrode. Hence, two electric double layers are formed; one at the interface of said first surface and its adjacent material, and another at the interface of said second surface and its adjacent material. In other words, the immobile ions carried by said electrolyte material, which is focused at the surface facing said semiconductor material, will attract oppositely charged charge carriers in said organic semiconductor material.

By adjusting the voltage drop within the formed electric double layers, the conductivity of said organic semiconductor material can be modulated. Hence, it is believed that the control of the transistor channel is achieved by means of charge redistribution, rather than electrochemistry.

Preferably, the electrolyte material is arranged such that when a voltage is applied across said material, all available charge carriers or all available and easily movable charge carriers are focused at said first and second surface, such that the electrostatic field within the bulk of the electrolyte material is close to zero at steady state. This is advantageous since the operation of the transistor does not depend substantially on the thickness of the polyelectrolyte layer, nor on the position of the gate electrode. Hence, a large flexibility on the device architecture and manufacturing process is facilitated.

Advantageously, only a small displacement of the charge carriers are required to form the desired electric double layers, thus enabling a fast response of the transistor. The larger the concentration of available charge carriers (ions) and the higher the ionic mobility within the electrolyte layer, the faster the response of the OFET and the lower the operating voltage.

One way of measure the concentration of available charge carriers within an acid electrolyte is to compute the number of mmole mobile ions per gram of dry resin. The amount of mmole mobile protons per gram of dry resin have been calculated for the following substances:

PVA 22.7 (polyvinyl alcohol, pKa 12-14 possibly higher)
PVPA 18.55 (polyvinyl phosfonic acid)
PAA 13.88 (poly acrylic acid)
PVPhOH 8.3.2 (poly(vinyl phenol), pKa 9-11)
PVSH 9.25 (polyvinyl sufphonic acid)
PSSH 5.43 poly(styrene-4-sulfonic acid)
Polysaccharide like amylase 18.5 (high pKa)
P(VPA-co-AA) 15.84, having a molar ratio of 85:15 and 10% PEG-DGE (Assuming consume max 2 mole of protons per mole PEG-DEG)

According to one embodiment of the invention said electrolyte layer preferably is an organic, organo-metallic or inorganic material which dissociates partially in ions. The organic electrolyte is preferably a molecular, macromolecular, oligomeric, polymeric electrolyte, selected from a group comprising for example ionic surfactants or ionic detergents, ionic liquids, fatty acids, amino-acid based molecules and polymers (such as proteins), saccharides or polysacharries, biomolecules and macromolecules with phosphate groups (e.g. DNA, phosphoglycerides, phospholipids), oligoions or polyions.

According to one embodiment of the invention said electrolyte layer comprises an acid-functional homopolymer or homooligomer or an acid-functional copolymer or cooligomer. In other words, the electrolyte layer of said field-effect transistor device preferably is a oligomeric or polymeric acid having at least one acid-functional group. Forming said electrolyte layer from acids, especially strong or moderately weak acids are more preferred, since the use of an acid normally reduces the amount of hydroxide (OH—) anions. When a negative voltage is applied to the gate electrode, available hydroxide ions in the electrolyte layer will be forced towards the organic semiconductor material. As a hydroxide ion is small, it might penetrate into the organic semiconductor material and cause an electrochemical doping of the transistor channel. Hydroxide ions that penetrate into the positively charged channel, can stabilise the positive polarons on the conjugated polymer. Hence, such a doping normally reduces the switching speed of the channel and makes the transistor slower. Thus, it is normally preferred to reduce the amount of available hydroxide ions in the electrolyte material. It is believed that an acidic polymer or oligomer electrolyte having a $pK_a$ value smaller than 8 is suitable for use in accordance with the invention. Even more preferred is a $pK_a$ value, which is smaller than 6 and most preferred is a $pK_a$ value smaller than 4.

Hence, said electrolyte layer preferably comprises additives, which facilitates the operation and/or manufacturing of said transistor device. For example, said oligomeric or polymeric acid of said electrolyte is preferably cross-linked, such that its mobility is reduced. Hence, it is not as likely to penetrate into the semiconductor material. Further, said oligomeric or polymeric acid is preferably cross-linked by an external cross-linker. It is even more preferred that said external cross-linker has two or more glycidyl groups. Advantageously, said external cross-linker is polyethylene glycol diglycidyl ether (PEG-DEG).

According to one embodiment of the invention said oligomeric or polymeric acid of said electrolyte layer is an oligomer or polymer of monomer units having phosphonic acid, sulphonic acid, carboxylic acid or phosphoric acid groups. Preferably, said monomer units have phosphonic acid groups, and even more preferred said monomer units are vinylphosphonic acid. Moreover, said monomer units advantageously have sulphonic acid groups, and even more preferred, said monomer units are styrene-4-sulphonic acid or a salt thereof, such as PSSNa poly(sodium 4-styrenesulfonate)

According to another embodiment of the invention said oligomeric or polymeric acid is a cooligomer or copolymer of first comonomer units having phosphonic acid, sulphonic acid, carboxylic acid or phosphoric acid groups, and second comonomer units having phosphonic acid, sulphonic acid, carboxylic acid or phosphoric acid groups, the first and second comonomer units being different. Advantageously, said first comonomer units have phosphonic acid groups, and even more preferred said first comonomer units are vinylphosphonic acid. Moreover, said second comonomer units preferably have carboxylic acid groups, and even more preferred said second comonomer units preferably are acrylic acid. More specifically, said first comonomer units are preferably vinylphosphonic acid and said second comonomer units are preferably acrylic acid, which advantageously is present in the cooligomer or copolymer at a molar ratio of vinylphosphonic acid to acrylic acid of higher than 50:50, preferably higher than 70:30 and even more preferred 85:15.

According to yet another embodiment of the invention said electrolyte is a composition of two or more oligomeric or polymeric acids as defined above. Advantageously, said electrolyte is a composition of a polymer of vinylphosphonic acid and a polymer of acrylic acid, preferably at a molar ratio of vinylphosphonic acid to acrylic acid of higher than 70:30. The use of copolymer or cooligomer of vinylphosphonic acid and acrylic acid is advantageous as such substances release a large concentration of protons and have a large proton mobility. Hence, the resulting electrolyte forms the electric double layers faster, which results in a fast response of the transistor.

Generally, it is not necessary that the gate electrode is arranged such that it faces said source and drain electrodes. In other words, the gate electrode may be laterally displaced along the surface of said electrolyte layer, with respect to said source and drain electrodes.

Advantageously, said organic semiconductor layer comprises organic dyes and pigments, such as aromatic molecules, conjugated molecules, organic photochromics, liquid crystals and/or discotic liquid crystals. Further, said organic semiconductor layer preferably comprises or ganometallic complexes and polymers, such as derivatives of porphines, phtalocyanine etc, as well as carbon nanotubes and fullerenes derivatives.

Advantageously, said organic semiconductor layer comprises molecular, oligomeric polymeric or dendrimeric conjugated materials. More preferably, wherein said molecular, oligomeric or polymeric conjugated materials of said organic semiconducting layer is selected from the group consisting of naphtalene, anthracene, tetracene, pentacene, hexacene, rubrene, phtalocyanines, porphyrines, and oligomers or polymers of anilines, pyrroles, thiophenes, fluorenes acetylenes, sulfur nitrides, diacetylenes, phenylenes, phenylenevinylenes, phenylene sulfides and derivatives thereof.

The thickness of the organic semiconductor layer is preferably larger than a monolayer (>0.5 nm). It is mainly the part of the organic semiconductor closest to the electrolyte that is affected by the applied gate potential. Increasing the organic semiconductor layer thickness will enlarge the current between source and drain when the transistor is turned off, and thus reduce the on/off current ratio of the transistor.

It is preferred that the electrolyte layer is fully covering, e.g. free from pinholes, to avoid large leakage currents between the gate electrode and the semiconductor layer. For that reason the electrolyte layer should be at least 10 nm thick. The electrolyte layer could be made much thicker (about 20 mm) using e.g. printing techniques.

Advantageously, said source and drain electrodes are each arranged of a different material compared to said organic semiconductor, especially when said transistor is an enrichment type transistor, as the conductivity of an enrichment type transistor initially is low.

Advantageously, said source electrode and/or said drain electrode and/or said gate electrode comprises a material selected from the group consisting of chromium, titanium, copper, aluminum, molybdenum, tungsten, nickel, gold, palladium, platinum, conducting polymers and oligomers, carbon paste, carbon nanotubes, silver paste and combination thereof.

When comparing the properties of a first transistor comprising an electrolyte layer containing PSSH, to a second transistor comprising an electrolyte layer containing P(VPA-AA), the inventors have found that although PSSH has a lower $K_a$ value than P(VPA-AA), the P(VPA-AA) transistor can be operated with a lower gate voltage. This is believed to be due to the fact that the number of available protons per volume of electrolyte layer is larger for the P(VPA-AA) electrolyte, compared to the PSSH electrolyte. The only difference between said first and second transistor was the composition of the electrolyte.

Basically, according to one embodiment the transistor channel of an OFET according to the invention is formed of an organic semiconductor layer located at the interface between the insulator and the organic semiconductor. This organic semiconductor layer arranged between a source and a drain electrode. The conductivity of the transistor channel is altered or controlled by changing the electric field created at the electrolyte-semiconductor interface. This altered electric field may be achieved by changing the voltage applied to the gate electrode, whereby the ions in the electrolyte are redistributed. Ions collected at the electrolyte-semiconductor interface attract compensation charges in the semiconductor by means of field effect, so that an electric double layer is formed at the interface, and the channel opens when enough charge carriers in the organic semiconductor are accumulated at said interface. The active section of the transistor channel is normally defined by the extension of the electric double layer in the organic semiconductor, which usually is in the order of a few nanometers. In other words, when a suitable voltage is applied to the gate electrode, ions are redistributed in the electrolyte layer, such that an electric field is created, which alters the polarisation of the semiconductor layer. There is no significant motion or transport of ions between the electrolyte and the transistor channel, i.e. the organic semiconductor. Hence, electrochemistry is thus prevented or at least substantially restricted from occurring in the organic semiconductor. In other words, an OFET is controlled by means of field-effect or a polarization of the organic semiconductor, rather than by electrochemistry.

One way of minimizing the penetration of charge carriers from the electrolyte into the organic semiconductor is to arrange the electrolyte such that it dissociates into smaller and substantially larger ion-complexes. Where the smaller ion-complexes have a first electric charge and the larger ion-complexes have the opposite electric charge, and the voltage applied to the gate electrode is arranged such that it attracts the smaller ion-complexes. These large ion-complexes preferably comprises long polymer chains or large molecules. The size of the larger ion-complexes either prevents them from penetration into the organic semiconductor, and/or makes them substantially immobile, such that they do not migrate to the interface between said electrolyte and said organic semiconductor to any significant extent. This effect is also achieved when the voltage applied to the gate electrode is not sufficiently high to effectuate any substantial displacement of the larger ion-complexes. In other words, the mobility of an ion is a combination of their size and the applied electric field.

The applied voltages should be chosen carefully. Too high voltages could produce mobile ions having such polarity that they could migrate into the semiconductor layer when a gate voltage is applied. Advantageously, gate control voltage or the voltage difference between said source and gate electrode is between −5 V and 0 V, preferably between −2 V and 0 V, more preferably between −1.5 V and 0 V, and most preferred between −1 V and 0 V. Further, according to one embodiment the electrolyte preferably comprises an ionic salt.

These and other aspects of the invention will be apparent from and elucidated with reference to the embodiment(s) described hereinafter.

BRIEF DESCRIPTION OF THE DRAWINGS

FIG. 8 is a (IV) diagram illustrating the properties of a transistor arranged in accordance with the transistor described in relation to FIG. 3a.

DETAILED DESCRIPTION OF PREFERRED EMBODIMENTS

Figure 1:
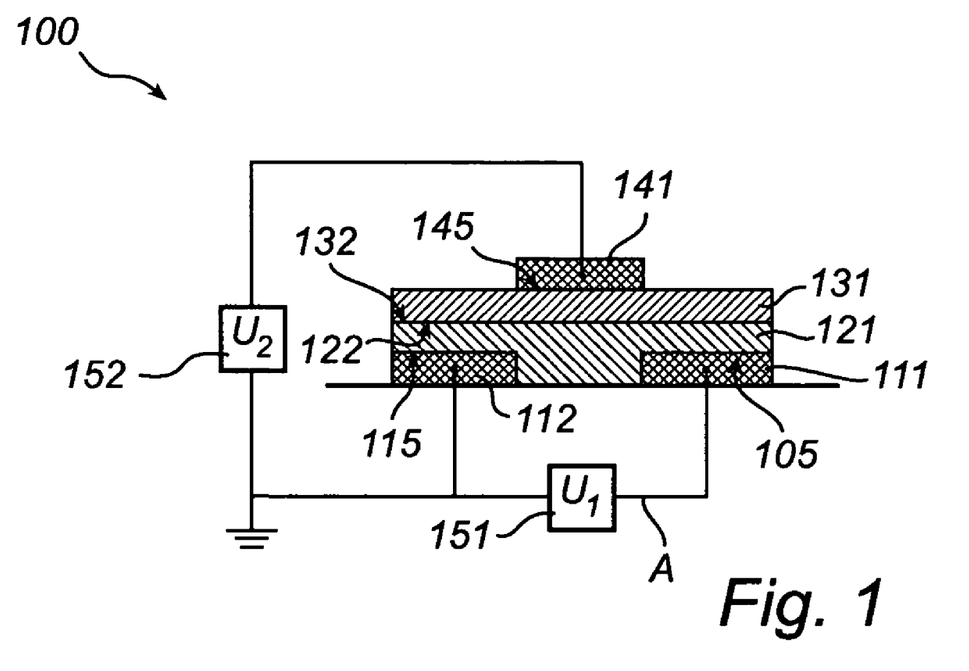
FIG. 1 schematically illustrates a cross section of a transistor according to the invention.

FIG. 1 schematically shows one embodiment of a field-effect transistor (100) according to the invention. The transistor comprises a source electrode (111) and a drain electrode (112), which are both in electronic contact with a semiconducting material (121). The semiconducting material is arranged such that its conducting properties can be varied, e.g. by altering its polarization. Hence, when a voltage (151) is applied between the source electrode (111) and the drain electrode (112), the size of the current (161) between said source and drain electrode (111,112) can be controlled by controlling the polarization of the semi-conductor material (121).

Further, an electrolyte (131) is arranged between said semiconductor material (121) and a gate electrode (141). The electrolyte and the semiconductor material are arranged such, that when a voltage (152,151) is applied across said electrolyte said semiconductor material will become polarized, due to an electric double layer formed at the two surfaces (122, 132) of said electrolyte and said organic material which faces each other. In other words, by adjusting the voltage applied to the gate electrode (141), the conducting properties of said semiconductor material is changed, and hence the current flow between the source and drain electrode (111,112). Consequently, it is not necessary that the semiconductor material and said electrolyte, nor the gate electrode and the electrolyte, are in physical contact with each other, as long as the desired polarization of the semiconductor material can be achieved. Preferably, the thickness of the said source and drain electrodes is in the range 30 nm to 500 nm.

Ideally, the current (161) between said source and drain electrodes (111,112) is zero when there is no electric field applied across said electrolyte. Moreover, ideally there is no electronic contact, i.e. no leakage current, between said gate electrode (141) and any of said source or drain electrodes (111,112).

Although P(VPA0.85-co-AA0.15), a random copolymer of vinylphosphonic acid (85%) and acrylic acid (15%), labelled P(VPA-AA) for the sake of simplicity, is used many the below described embodiments, the man skilled in the art will from the information given in this document be able to make any necessary adjustments in order to use the other substances described herein instead of P(VPA-AA). The manufacturing process is identical up to and including the semiconductor layer in all the below described embodiments. The process can be described as follows: s silicon wafer with thermally grown silicon oxide is used as substrate. A thin gold film is evaporated onto the substrate surface, and then patterned using photolithography and wet etching techniques to form the source and drain electrodes (that define the channel). On each test chip there are six different channel lengths (ranging from about 2 μm to about 40 μm) and three different channel widths (ranging from 200 μm to 2,000 μm), resulting in eighteen possible combinations. The semiconducting polymer, regio-regular poly(3-hexylthiophene) (P3HT), was thereafter spincoated from chloroform giving a thickness of at least 10 nm. The film was dried at 60° C. for a few minutes.

Figure 2A:
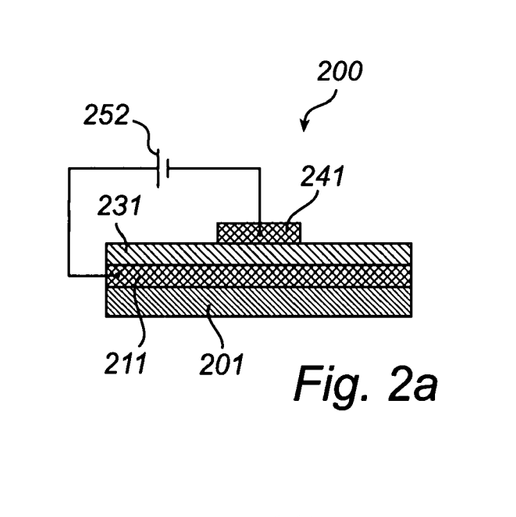
FIGS. 2a and 2b schematically illustrate the capacitive properties of P(VPAA-AA).
Figure 2B:
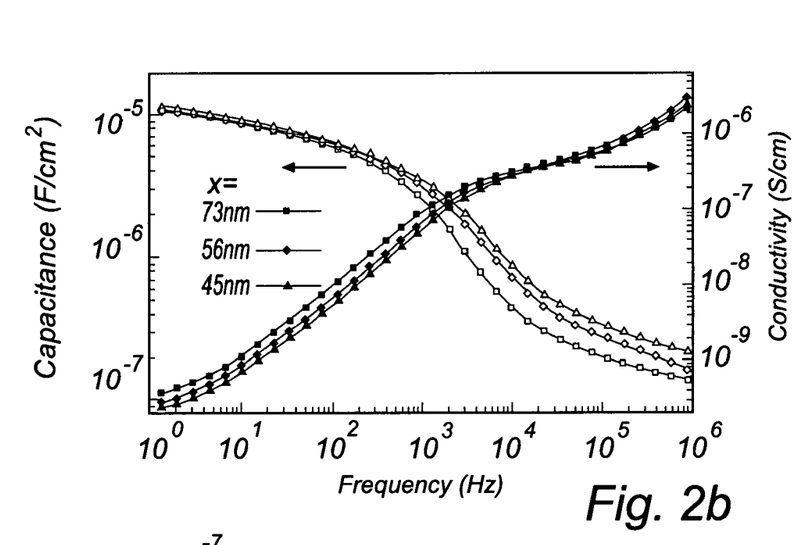

The capacitive properties of P(VPA-AA) are schematically illustrated by FIGS. 2a and 2b. The device is made by sandwiching P(VPA-AA) (231) between two Ti metal electrodes (211,241) and characterized using impedance spectroscopy. The P(VPA-AA) layer was spin coated on top of the semiconductor, followed by annealing at 110° C. Said Titanium electrode was subsequently evaporated through a shadow mask to form the gate electrode. The driving frequency vs. the capacitance $C_i$ (left axis) and the conductivity (right axis), respectively, are presented for three different thicknesses, approximately 45, 56 and 73 nm, of the P(VPA-AA) film (231) as illustrated in FIG. 2b. $C_i$ demonstrates distinct behavior in two frequency regimes. At high frequencies (10 kHz to 1 MHz), $C_i$ scales inversely with the thickness of the P(VPA-AA) film. Large effective dielectric strengths are common in hydrated polyelectrolyte systems, attributed to ions or protons that migrate away from the polymer chain in agreement with the high conductivity measured in that frequency range ($2.5 \times 10^{-7}$ S/cm to $3.2 \times 10^{-6}$ S/cm). FIG. 2b shows that at 10 kHz a dramatic increase in capacitance and decrease in conductivity are observed, defining the low frequency regime (below 1 kHz). Here, $C_i$ is between 2.5 to 11 $\mu F/cm^2$ and does normally not depend on the P(VPA-AA) film (231) thickness, in fact the capacitance value seems to be fully decoupled from the distance between electrodes. The major contribution to $C_i$ at low frequency is interpreted as the response of the electric double layers formed at the P(VPA-AA)/Ti (231/211) interfaces, as well as the polarization within the dielectric media, due to polyanion and condensed counterion relaxation.

Figure 3A:
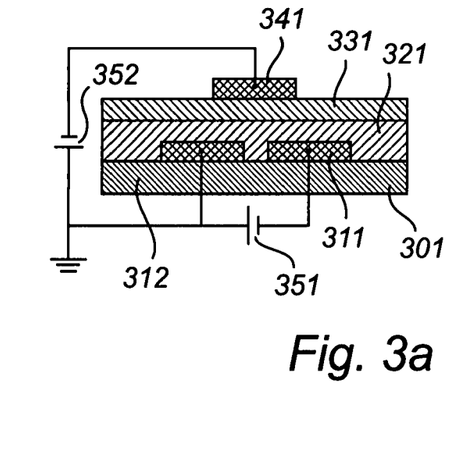
FIGS. 3a and 3b schematically illustrate a first embodiment of an OFET according to the invention, and its properties, respectively.
Figure 3B:
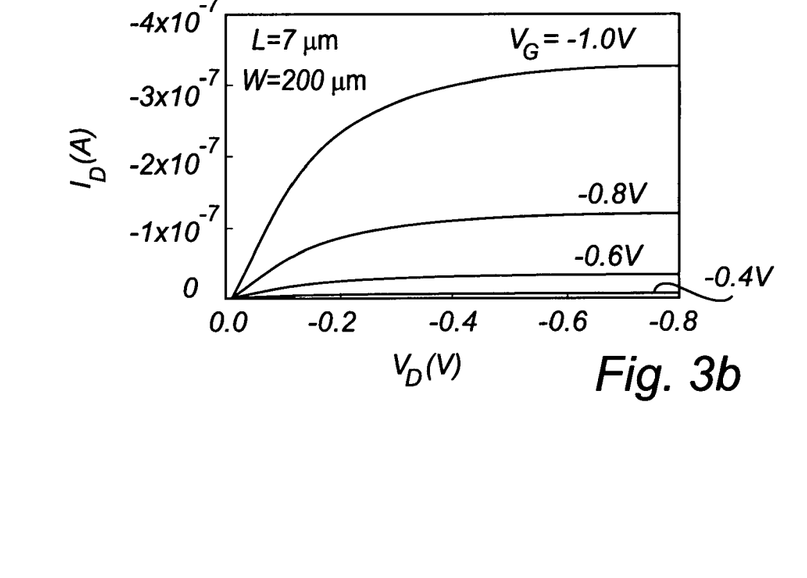
Figure 8:
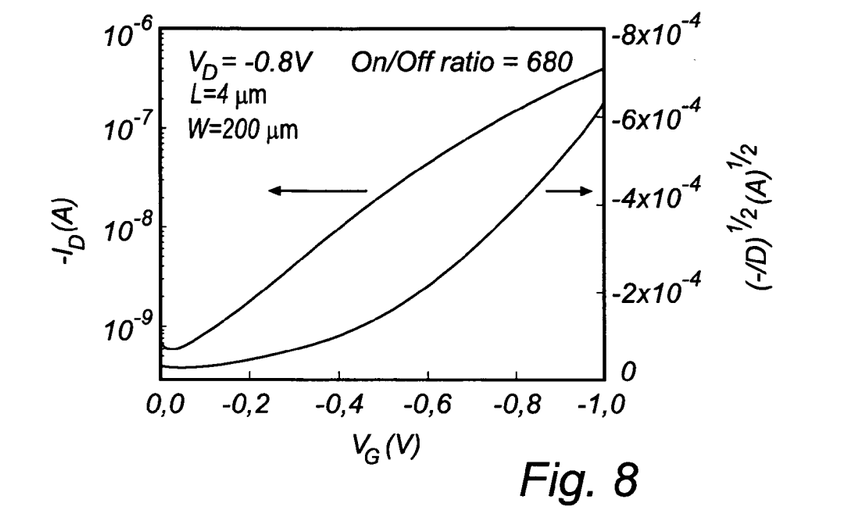

A vertical OFET, the cross section of which is schematically illustrated in FIG. 3a, comprising regio-regular poly(3-hexylthiophene) (P3HT) (10 nm thick) (321) which was spin-coated from chloroform on a Si substrate (301) with gold source and drain electrodes (311;312). The electrolyte layer or ion-conducting material (331) P(VPA-AA) (56 nm thick) was subsequently spin-coated on top of the organic semiconductor (321). A Ti gate electrode (341) was vacuum deposited to complete the transistor. In FIG. 3b, the output (I-V) characteristics of the OFETs show significant current modulation below 1 V. The channel current saturates at a drain voltage $V_D$ (351) below the applied gate voltage $V_G$ (352) (e.g. $VD_{sat}=-0.2$ V for $V_G=-1V$). The large saturation current ($ID_{sat}=-0.3$ μA) obtained for low operation voltage ($V_G=-1$ V) reflects the large capacitance $C_i$ of P(VPA-AA). The relationship between those quantities is illustrated via conventional semiconductor theory that reproduces the general trends in OFET characteristics:

$$I_D^{sat} = \frac{W}{2L} \mu C_i (V_G - V_T)^2 \quad (Eq. 1)$$

where $C_i$ is the gate dielectric capacitance per unit area, μ the charge carrier mobility, W and L are the gate width and length, respectively, and $V_T$ is the threshold voltage. Note that large capacitance allows for larger channel length, which can be obtained by printing techniques. FIG. 8 reveals that $(-I_D)^{1/2}$ is not linearly proportional to $V_G$ at saturation ($V_D=-0.8$ V). This deviation from Eq. 1 is typical for an electric field dependent mobility, but might also arise from the non-linear capacitance of the double-layers as a function of $V_G$ at the metal-electrolyte and electrolyte-semiconductor interfaces. Despite the uncertainty regarding $V_T$ and $C_i$ measured at low frequency, the extracted field-effect mobility lies between 0.008 and 0.018 cm2/Vs (calculated for $V_T$ varying between $-0.4V$ and $-0.6$ V, $C_i=10$ μF/cm2, at $V_G=-1$ V and $V_D=-0.8$ V).

In experiments several different transistors, equal to the embodiment described in relation to FIG. 3a, except that the layer thickness of said electrolyte layer has varied between 45 to 180 nm, have been proven successful.

Figure 9:
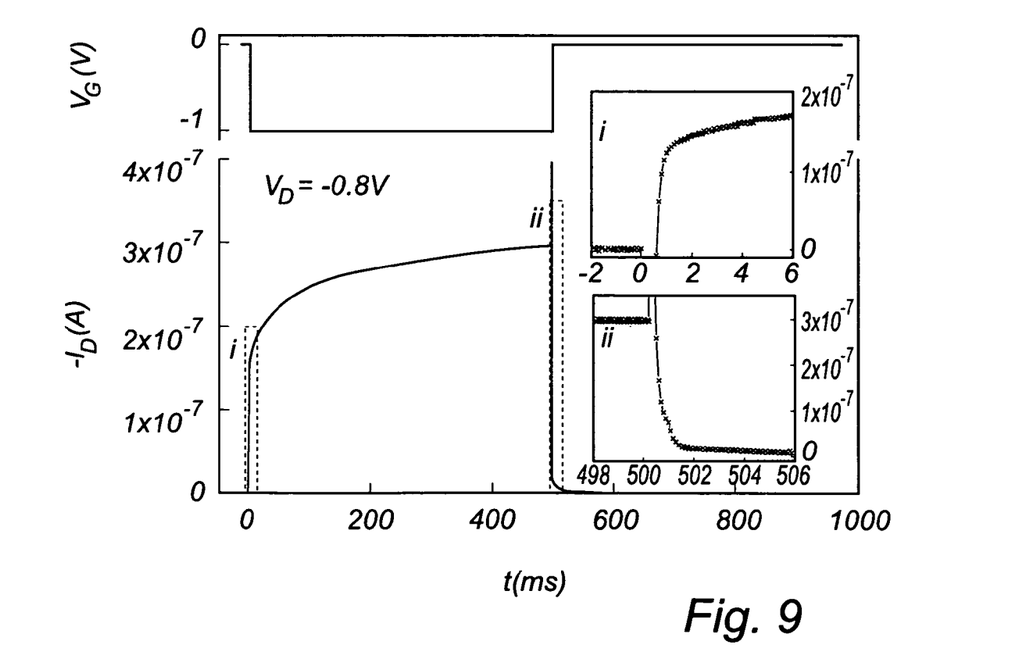
FIG. 9 illustrates the step response of a transistor according to the invention.

In addition to the current-voltage characteristics, the time response of a transistor is of tremendous importance to applications in electronics. Transient measurements are performed by applying a square shaped pulse ($V_G$), from 0 V to $-1$ V and vice versa, to the gate while the drain electrode was held at a constant potential of $-0.8$ V, FIG. 9. In both rise and fall, the drain current displays two distinct behaviors, occurring over different time scales. The fast component occurs in about 0.5 ms (i, upper smaller diagram of FIG. 9) and includes about 60% of the response. This is believed to be attributed to the formation of an electric double layer at the P(VPA-AA)/titanium interface and a proton depletion layer at the P3HT/P(VPA-AA) interface. The slower component is much more pronounced in the rise response than in the fall (ii, lower smaller diagram of FIG. 9) and takes about 0.5 s. This is believed to be attributed to relaxation/rearrangement of polyanion chains and condensed ions observed at frequency lower than 1 kHz in FIG. 3b. The two time scales are clearly visible in the evolution of the capacitance with frequency, the capacitance nearly doubling as the frequency decreases from 1 kHz to 1 Hz.

The following arguments suggest that opening the channel is analogous to electrochemically doping at the monolayer level, i.e. the channel is limited to a few positively doped P3HT monolayers at the interface with P(VPA-AA), as is the case in ordinary OFETs. First, the polyanionic chains cannot penetrate the P3HT film when the gate is negatively biased because they are effectively immobile, due to e.g. their size, possible crosslinks etc. Second, charge consumption in P3HT electrochemical cells typically occurs over a time-scale of seconds or hundreds of ms (depending on the length-scales and ions concentration involved), while the devices according to the invention exhibits transient times below 1 ms. Third, the trends and nature of the current-voltage characteristics of this device agree well with "traditional" OFET characteristics, with the exception that the applied voltage necessary for device operation is markedly lower.

Figure 11:
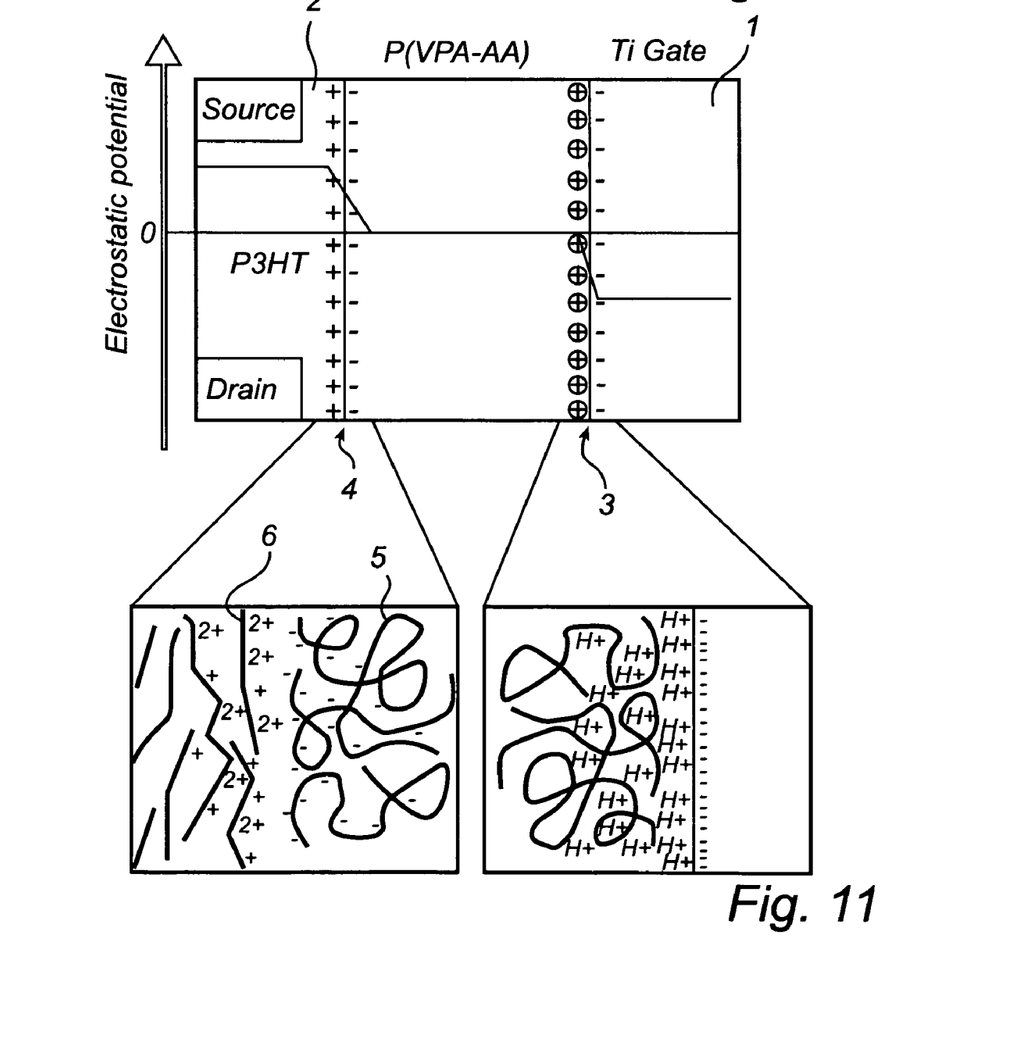
FIG. 11 schematically illustrates the electrostatic potential along a cross section of a transistor according to the invention.

Referring now to FIG. 11, comprising two schematic enlargements below the upper diagram, which diagrams illustrate the interfacial layers. P(VPA-AA), like other electrolytes, focuses the electric field caused by a potential applied between two electrodes (1;2) (in our case the gate and the organic channel) within electric double layers (3,4) as close to each electrode as possible. In the above described embodiments, protons are attracted to the gate electrode (1), and form an electric double layer (3), such as an Helmholtz layer. At the channel, deprotonated P(VPA-AA) (5) close to the positively-doped P3HT chains (6) form an electric double layer (4) creating a large electric field at the interface. As a consequence, the electrostatic field within the bulk of the polyelectrolyte is close to zero at steady-state. There is a line running horizontally through FIG. 11, which line schematically illustrates the electrostatic potential at different positions within the transistor. Most of the voltage drop occurs across the cation-depleted region at the P3HT/P(VPA-AA) interface (4) and the electric double layer or a Helmholtz layer (protons) at the P(VPA-AA)/Ti interface (3). The rapid charging of these interfacial capacitors, requiring only small displacement of protons, is responsible for the fast response of the transistor.

Figure 4A:
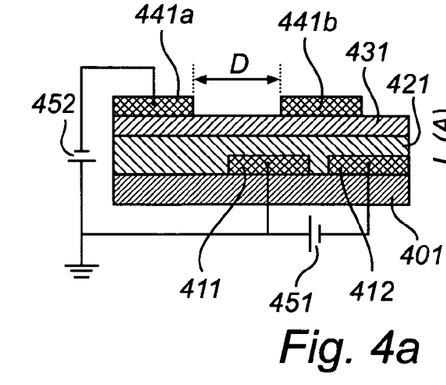
FIGS. 4a and 4b schematically illustrate a second embodiment of an OFET according to the invention, and its properties, respectively.
Figure 4B:
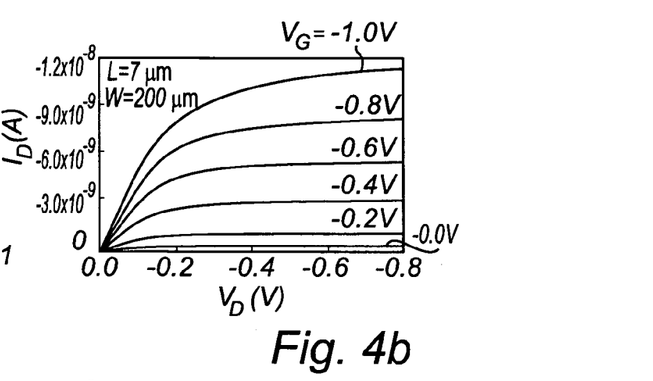

According to the electrolyte model, a polymer transistor gated via a polyanion electrolyte normally do not depend significantly on the thickness of the "dielectric" layer, nor on the position of the gate electrode. FIG. 4a schematically illustrates a second embodiment of the invention, equal to the embodiment described in relation to FIGS. 1 and 3a, except that the gate electrode (441b) is laterally displaced a distance D from the position illustrated in FIGS. 1 and 3a, respectively. The distance between the channel and the gate electrode was varied between 1.25 and 10 mm. In other words, instead of using the designated gate electrode (441a) positioned on top of the channel, the gate electrodes of neighbouring transistor structures was used, i.e. the conventional source and drain electrodes (411;412) together with the neighbouring gate electrode (441b). The (I-V) relationship of the transistor illustrated in FIG. 4a is described in FIG. 4b. Although the channel current level is smaller, due to a potential drop over such a relatively long distance in the solid electrolyte, saturation occurs at the same voltages observed in the transistor with a gate-channel separation of only 56 nm (FIG. 3a).

Figure 5A:
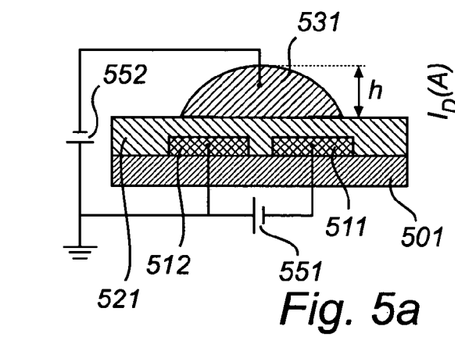
FIGS. 5a and 5b schematically illustrate a third embodiment of an OFET according to the invention, and its properties, respectively.
Figure 5B:
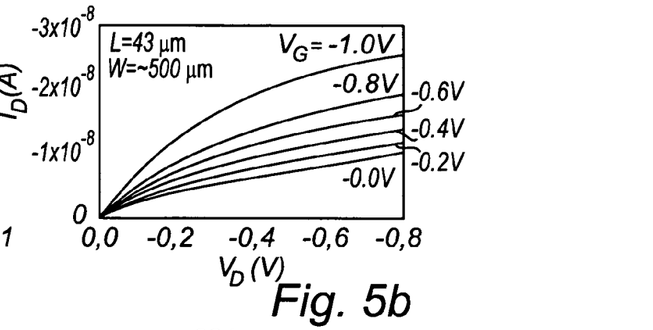

According to a third embodiment, schematically illustrated by FIG. 5a, a much thicker P(VPA-AA) layer (531) is cast from a drop on P3HT (521). More specifically, a drop of concentrated P(VPA-AA) solution is deposited on top of the channel and let for 10 min at 110° C. This results in a hemispherically shaped gate insulator (531). A metal wire, contacted to the polyelectrolyte, is used as a gate electrode. The transistor behavior is similar to those of the transistors illustrated in the previous figures, although high leakage currents were recorded at $V_G=0$ V.

Figure 6A:
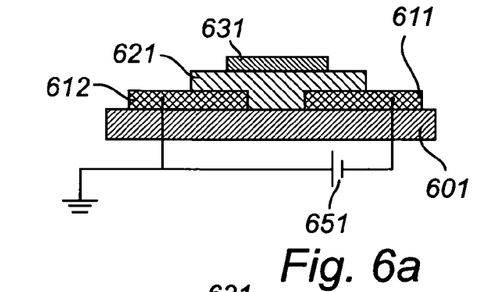
FIGS. 6a, 6b and 6c schematically illustrate an transistor according to the invention.
Figure 7A:
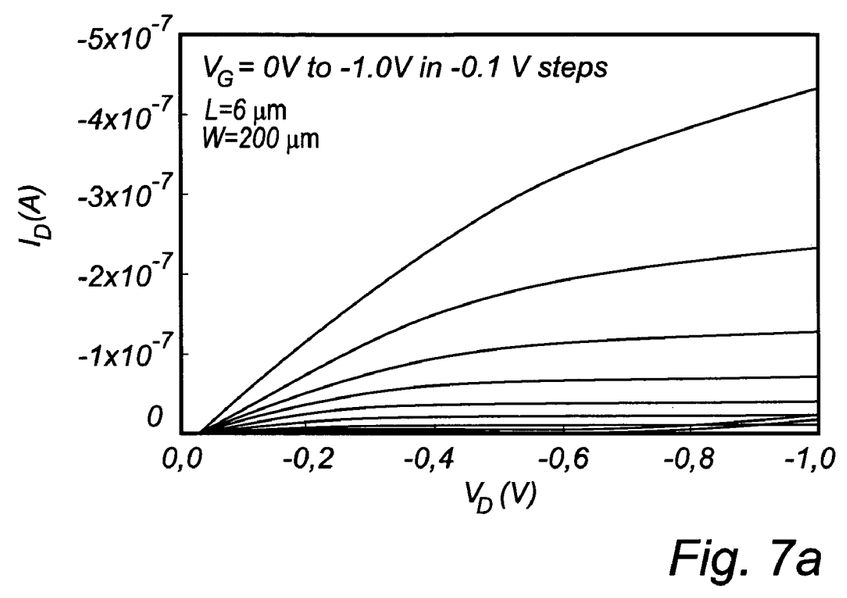
FIGS. 7a and 7b illustrate the properties of two different transistors according to the invention.
Figure 7B:
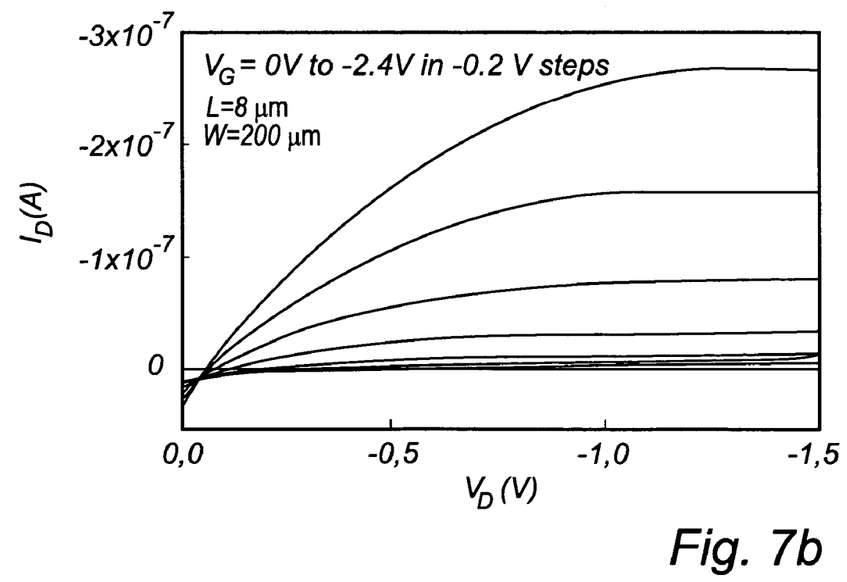

In a fifth embodiment of the invention another class of polyelectrolyte materials, poly(styrene sulfonate) (PSS), has also been tested. PSS was spin coated on top of P3HT giving a thickness of about 100 mm. A Titanium gate electrode was prepared using the same method as for the above described transistors. A schematic cross section of the device is shown in FIG. 6a. Actually, two different PSS-based polymers have been tested: poly(styrene-4-sulfonic acid) (PSSH) and poly (sodium 4-styrenesulfonate) (PSSNa). The latter polymer is the sodium salt of the first polymer. In PSSNa it is probably mainly $Na^+$-ions, instead of protons that migrate through the polyelectrolyte film towards the gate electrode when a negative gate potential is applied. As a consequence, PSSNa-based transistors are slower than PSSH-based. FIG. 7a is a diagram showing $I_D$ vs. $V_D$ for a P3HT transistor with an about 100 nm thick PSSNa gate insulator, measured in humid air (relative humidity ~40%) at room temperature. FIG. 7b illustrates $I_D$ vs. $V_D$ for a P3HT transistor with an about 100 nm thick PSSH gate insulator, measured in humid air (relative humidity ~40%) at room temperature.

Figure 6B:
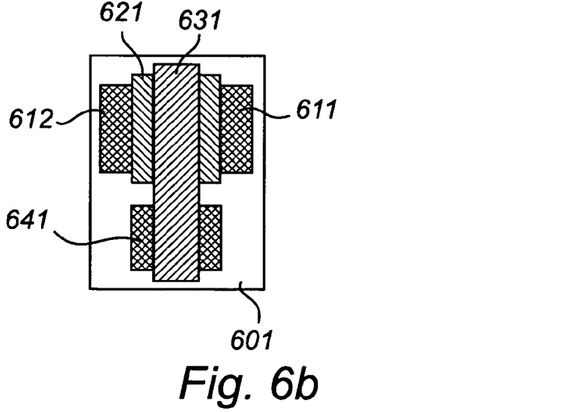
Figure 6C:
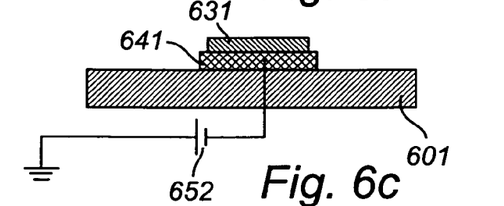

According to a sixth embodiment the gate, source and drain electrodes (611;612;641) are all located on the same substrate (601). FIG. 6b is a top view of said sixth embodiment, and FIGS. 6a and 6c illustrate a respective cross section along the lines a-a and c-c, respectively. Said source and drain electrodes (611;612) are both in electrical contact with a semiconducting layer (621). Further, an electrolyte (631) is arranged on top of said gate electrode (641) and said semiconductor layer (621). Preferably said source and drain electrodes are covered by said semiconductor layer (621), such that physical contact between said source electrode (611) and the electrolyte layer (631), as well as physical contact between said drain contact (612) and the electrolyte layer (631) is substantially eliminated.

When an electric voltage (652;651) is applied between said electrodes (611;612;641), through said electrolyte (631), an electric double layer is formed at the whole interface between said electrolyte (631) and said organic semiconductor material (621). The distribution of the ions is determined by the spatial arrangement of said electrodes.

Said three electrodes can be aligned, or said gate electrode can be arranged to the side of said source and drain electrodes, as is illustrated by FIG. 7b. In other words, the location of the gate electrode can be varied, such that a desired electric double layer is formed. By varying the location of the gate electrode the concentration of ions at a predetermined position of the interface between said electrolyte and said semiconductor material can be adjusted.

Functionally, in the above described sixth embodiment of the invention, an electric double layer is formed at the interface between said semiconductor material and said electrolyte, when a voltage is applied to said electrodes. This electric double layer opens the transistor channel, such that the current between said source and drain is increased. In other words, it is not necessary that the gate electrolyte is sandwiched by said gate electrode and said semiconductor material. Hence, there are embodiments of the inventive transistor wherein said source, drain and gate electrodes are arranged in or on a common plane. Also in these latter embodiments two pair of electric double layers are formed. A first electric double layer is formed at the interface between the gate electrode and the electrolyte, and a second at the interface between the semiconductor material and the electrolyte. The potential applied to said gate electrode is preferably lower than the potential applied to said source electrode, and the potential applied to said drain electrode. There are no special requirements on the materials used in this lateral embodiment of the transistor, compared to other described embodiments.

Figure 10:
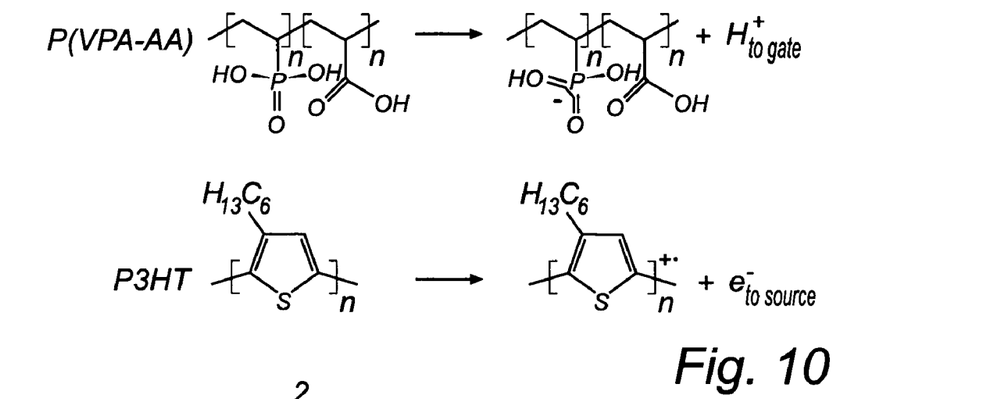
FIG. 10 schematically illustrates P(VPA-AA) and P3HT.

FIG. 10a schematically shows a dissociation of P(VPA-AA), wherein protones are released from the polymer molecule. Dissociated protones are highly mobile within the electrolyte layer, such that they will electromigrate towards the gate, when a negative potential is applied thereto.

In the above embodiments, the inventors have shown that an acid ion conductor can be used as a high capacitance layer in an OFET, significantly improving upon the insulating thin film traditionally used to separate the gate and channel. The quick formation of large electric double layer capacitance (10 µF/cm2) at the critical interface as the transistor is gated result in a fast-responding (<1 ms), high current throughput (1 µA), low-voltage (1 V) and robust transistor. Such a transistor has clear applications in large transistor-to-transistor logic networks, radio-frequency identification technologies and matrixed organic light-emitting diode displays. Employing a polyelectrolyte "insulating" layer also eases design and manufacturing requirements. Patterning critical dimensions and depositing a thin gate insulator become unnecessary since a nanometer-scale "capacitor" spontaneously forms as the gate is biased. Simple architectures with all three terminals on the same substrate are possible, in principle. The resulting flexibility makes printing (as well as other inexpensive techniques) a viable manufacturing platform.

A person skilled in the art will given the above described conditions be able to select suitable electrode materials, semiconductor material and electrolytes. He also realizes that the present invention by no means is limited to the embodiments described above. On the contrary, many modifications and variations are possible within the scope of the appended claims. For example, the shape of the electrodes can be modified such as to provide a stronger electric field across the electrolyte, or an additional electrode besides, the source and drain electrodes, can be arranged on the opposite side of said organic semiconductor material compared to said gate electrolyte, which additional electrode is not in electronic contact with said organic semi conducting layer. Further, it is known to a man skilled in the art that the transistor can be manufactured by e.g. screen printing, flexo printing, ink-jet printing, gravure printing, offset printing, spin coating, evaporation, chemical vapor deposition, electrodeposition, and electroless plating.

The invention claimed is:

1. A field-effect transistor device comprising:
   an organic semiconductor layer;
   a source electrode arranged in electronic contact with said organic semiconductor layer;
   a drain electrode arranged in electronic contact with said organic semiconductor layer;
   a gate electrode; and
   an electrolyte layer, which is arranged between said gate electrode and said organic semiconductor layer, and which includes molecular, oligomeric, polymeric or dendrimetic electrolyte which includes a medium further including ions having a dissociation constant of at least $10^{-8}$ in said medium,
   wherein the field-effect transistor device is configured so that a current between said source and drain electrodes within said organic semiconductor layer is primarily controlled by means of a polarization of said electrolyte layer, which induces charge carriers in said semiconductor layer,
   the field-effect transistor device is configured so that the electrolyte is dissociated into at least a small ion-complex having a first electric charge; and a large ion-complex having an opposite electric charge to said first electric charge, and
   wherein the larger ion-complexes, due to their size, are prevented from penetrating into said organic semiconductor layer, at least when a control voltage is applied to said gate electrode.

2. A device according to claim 1, wherein said large ion-complex is substantially immobile, at least when a control voltage is applied to said gate electrode.

3. A device according to claim 1, wherein said large ion-complex is an anion, and said small ion-complex is a cation.

4. A device according to claim 1, wherein said control voltage is between −5 V and 0 V, preferably −2 V and 0 V, more preferably between −1.5 V and 0V and most preferably between −1 and 0 V.

5. A field-effect transistor device according to claim 1, wherein said electrodes are arranged such that an application of a predetermined voltage between said gate electrode and said source and/or drain electrode forms an electric double layer at the interface of said organic semiconductor layer and said electrolyte layer.

6. A field-effect transistor device according to claim 1, wherein oligomeric or polymeric electrolyte having a dissociation constant of at least $10^{-6}$ or even more preferred of at least $10^{-3.5}$.

7. A field-effect transistor device according to claim 1, wherein said electrolyte layer includes more than 4 mmol mobile cations per gram electrolyte.

8. A field-effect transistor device according to claim 7, wherein said electrolyte layer includes more than 5 mmol mobile protons per grain dry electrolyte.

9. A field-effect transistor device according to claim 1, wherein said electrolyte is an oligomeric or polymeric acid having at least one acid-functional group, or a salt thereof.

10. A field-effect transistor device according to claim 9, wherein the most acidic acid-functional group of said oligomeric or polymeric acid has a $pK_a$ value of less than 6.

11. A field-effect transistor device according to claim 10, wherein said oligomeric or polymeric acid is an oligomer or polymer of monomer units having phosphonic acid, sulphonic acid, carboxylic acid or phosphoric acid groups.

12. A field-effect transistor device according to claim 11, wherein said monomer units have phosphonic acid groups, said monomer units preferably being vinylphosphonic acid.

13. A field-effect transistor device according to claim 11, wherein said monomer units have sulphonic acid groups, said monomer units preferably being styrene-4-sulphonic acid or a salt thereof.

14. A field-effect transistor device according to claim 11, wherein said oligomeric or polymeric acid is a cooligomer or copolymer of first comonomer units having phosphonic acid, sulphonic acid, carboxylic acid or phosphoric acid groups, and second comonomer units having phosphonic acid, sulphonic acid, carboxylic acid or phosphoric acid groups, the first and second comonomer units being different.

15. A field-effect transistor device according to claim 14, wherein said first comonomer units have phosphonic acid groups, said first comonomer units preferably being vinylphosphonic acid.

16. A field-effect transistor device according to claim 14, wherein said second comonomer units have carboxylic acid groups, said second comonomer units preferably being acrylic acid.

17. A field-effect transistor device according to claim 14, wherein said first comonomer units are vinylphosphonic acid and said second comonomer units are acrylic acid, preferably being present in the cooligomer or copolymer at a molar ratio of vinylphosphonic acid to acrylic acid of higher than 50:50.

18. A field-effect transistor device comprising:
   an organic semiconductor layer;
   a source electrode arranged in electronic contact with said organic semiconductor layer;
   a drain electrode arranged in electronic contact with said organic semiconductor layer;
   a gate electrode; and
   an electrolyte layer, which is arranged between said gate electrode and said organic semiconductor layer, and which includes a molecular, oligomeric, polymeric or dendrimetic electrolyte which includes a medium further including ions having a dissociation constant of at least $10^{-6}$ in said medium,
   wherein the field-effect transistor device is configured so that a current between said source and drain electrodes within said organic semiconductor layer is primarily controlled by means of a polarization of said electrolyte layer, which induces charge carriers in said semiconductor layer,
   the field-effect transistor device is configured so that the electrolyte is dissociated into at least a small ion-complex having a first electric charge; and a large ion-complex having an opposite electric charge to said first electric charge,
   wherein the larger ion-complexes, due to their size, are prevented from penetrating into said organic semiconductor layer, at least when a control voltage is applied to said gate electrode;
   wherein said electrodes are arranged such that an application of a predetermined voltage between said gate electrode and said source and/or drain electrode forms an electric double layer at the interface of said organic semiconductor layer and said electrolyte layer; and wherein said electrolyte is a composition of two or more oligomeric or polymeric acids, each defined as in any one of claims 9 to 17.

19. A field-effect transistor device according to claim 18, wherein said electrolyte is a composition of a polymer of vinylphosphonic acid and a polymer of acrylic acid, preferably at a molar ratio of vinylphosphonic acid to acrylic acid of higher than 70:30.

20. A field-effect transistor device according to claim 18, wherein said oligomeric or polymeric acid is cross-linked.

21. A field-effect transistor device according to claim 9, wherein said oligomeric or polymeric acid is cross-linked.

22. A field-effect transistor device according to claim 21, wherein said oligomeric or polymeric acid is cross-linked by an external cross-linker.

23. A field-effect transistor device according to claim 22, wherein the external cross-linker has two or more glycidyl groups.

24. A field-effect transistor device according to claim 23, wherein the external cross-linker is polyethylene glycol diglycidyl ether.

25. A field-effect transistor device according to claim 1, wherein said organic semiconductor layer includes an oligomeric or polymeric semiconductor.

26. A field-effect transistor device according to claim 25, wherein said oligomeric or polymeric semiconductor is selected from a group including polyalkylthiophenes, naphthalene, anthracene, tetracene, pentacene, hexacene and derivatives thereof.

27. A field-effect transistor device according to claim 1, wherein said source electrode includes a material selected from a group including chromium, titanium, copper, aluminum, molybdenum, tungsten, nickel, gold, palladium, platinum, conducting polymers and oligomers, carbon nanotubes, carbon paste, silver paste and combination thereof.

28. A field-effect transistor device according to claim 1, wherein said drain electrode includes a material selected from a group including chromium, titanium, copper, aluminum, molybdenum, tungsten, nickel, gold, palladium, platinum, conducting polymers and oligomers, carbon nanotubes, carbon paste, silver paste and combination thereof.

29. A field-effect transistor device according to claim 1, wherein the field-effect transistor device is configured so that the electrolyte is not in direct contact with the source electrode.

30. A method of controlling an organic field-effect transistor having an organic semiconductor layer, a source electrode arranged in electronic contact with said organic semiconductor layer, a drain electrode arranged in electronic contact with said organic semiconductor layer, a gate electrode; and an electrolyte layer, which is arranged between said gate electrode and said organic semiconductor layer, and which includes a molecular, oligomeric, polymeric or dendrimetic electrolyte which includes a medium further including ions having a dissociation constant of at least $10^{31\ 8}$ in said medium, the method comprising:

arranging the electrolyte layer such that the electrolyte dissociates into smaller ion-complexes having a first electric charge, and substantially larger ion-complexes having an opposite electric charge to that of the first electric charge, wherein the larger ion-complexes, due to their size, are prevented from penetrating into said organic semiconductor layer, at least when a control voltage is applied to said gate electrode; and controlling a current within an organic semiconductor layer by polarizing an electrolyte layer such that charge carriers are induced in said semiconductor layer.

31. A method of controlling an organic field-effect transistor according to claim 30 further comprising:

arranging the electrolyte such that the electrolyte is not in direct contact with the source electrode.

* * * * *